United States Patent
Hwang et al.

(10) Patent No.: US 8,119,229 B2
(45) Date of Patent: Feb. 21, 2012

(54) MULTIPLE-LAYER, MULTIPLE FILM HAVING THE SAME AND ELECTRONIC DEVICE HAVING THE SAME

(75) Inventors: Jang-Yeon Hwang, Seoul (KR); Dong-Ryul Kim, Daejeon Metropolitan (KR); Gi-Cheul Kim, Daejeon Metropolitan (KR); Sang-Uk Ryu, Daejeon Metropolitan (KR); Ho-Jun Lee, Daejeon Metropolitan (KR); Eun-Sil Lee, legal representative, Daejeon Metropolitan (KR); Seung-Lac Ma, Chungju-si (KR); Myeong-Geun Ko, Chungju-si (KR)

(73) Assignee: LG Chem, Ltd., Seoul (KR)

( * ) Notice: Subject to any disclaimer, the term of this patent is extended or adjusted under 35 U.S.C. 154(b) by 115 days.

(21) Appl. No.: 12/452,613

(22) PCT Filed: Jul. 11, 2008

(86) PCT No.: PCT/KR2008/004119
§ 371 (c)(1),
(2), (4) Date: Jan. 12, 2010

(87) PCT Pub. No.: WO2009/008687
PCT Pub. Date: Jan. 15, 2009

(65) Prior Publication Data
US 2010/0136308 A1 Jun. 3, 2010

(30) Foreign Application Priority Data
Jul. 12, 2007 (KR) .................. 10-2007-0069990

(51) Int. Cl.
*B32B 7/02* (2006.01)

(52) U.S. Cl. ........ 428/220; 428/212; 252/512; 252/513; 252/514

(58) Field of Classification Search .................. 428/212, 428/220; 252/512, 513, 514
See application file for complete search history.

(56) References Cited

FOREIGN PATENT DOCUMENTS

| JP | 2005-288851 A | 10/2005 |
|---|---|---|
| JP | 2006-044231 A | 2/2006 |
| JP | 2006-239883 A | 9/2006 |
| JP | 2006-334865 A | 12/2006 |
| KR | 10-0191797 | 1/1999 |
| KR | 10-2006-0044782 | 5/2006 |
| KR | 10-2007-0011462 | 1/2007 |

OTHER PUBLICATIONS

Yasuo et al (JP 2006-239883 machine translation), Sep. 14, 2006.*

* cited by examiner

*Primary Examiner* — David Sample
*Assistant Examiner* — Lawrence Ferguson
(74) *Attorney, Agent, or Firm* — McKenna Long & Aldridge LLP

(57) ABSTRACT

The present invention provides a multiple layer that comprises two or more first inorganic material layers; and one or more second inorganic material layers that are positioned between the two first inorganic material layers and have the thickness of less than 5 nm, in which the first inorganic material layer is formed of one or more materials that are selected from silicon oxides, silicon carbide, silicon nitride, aluminum nitride and ITO, and the second inorganic material layer is formed of one or more materials that are selected from magnesium, calcium, aluminum, gallium, indium, zinc, tin, barium, and oxides and fluorides thereof, a multiple film that comprises the multiple layer, and an electronic device that comprises the multiple film.

20 Claims, 4 Drawing Sheets

[Fig. 1]
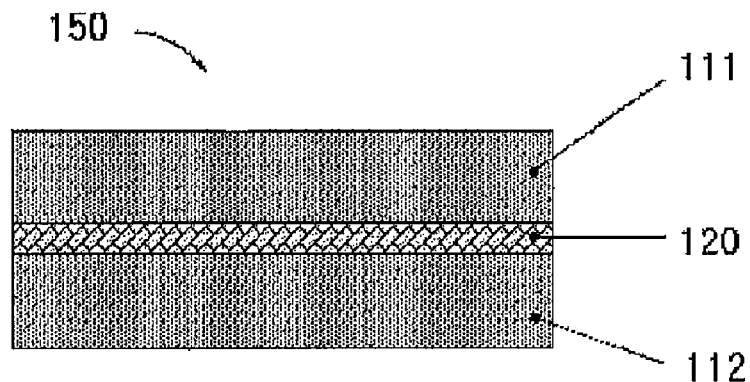
[Fig. 2]
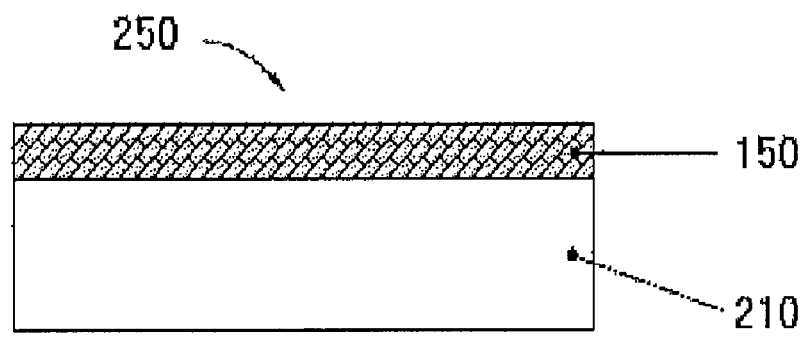
[Fig. 3]
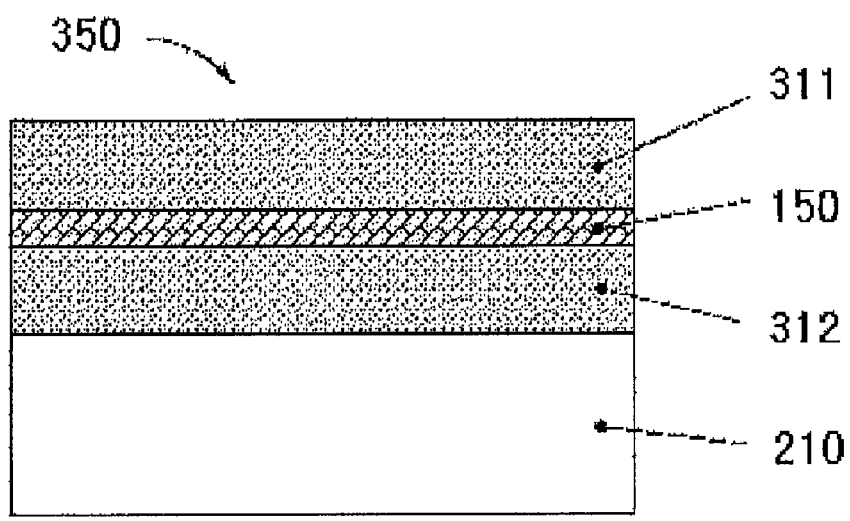

[Fig. 4]
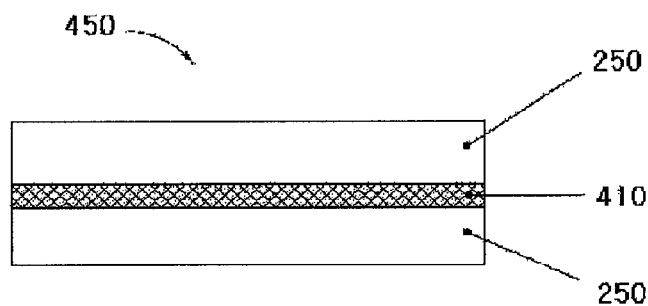
[Fig. 5]
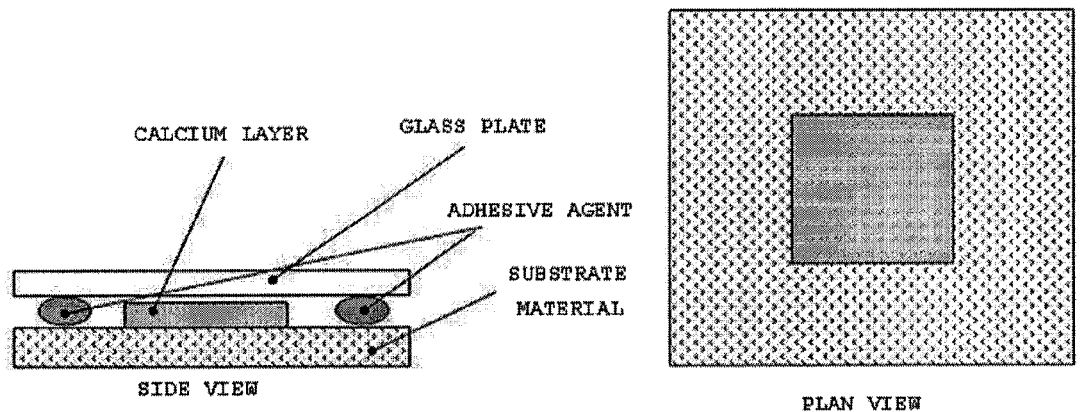

[Fig. 6]
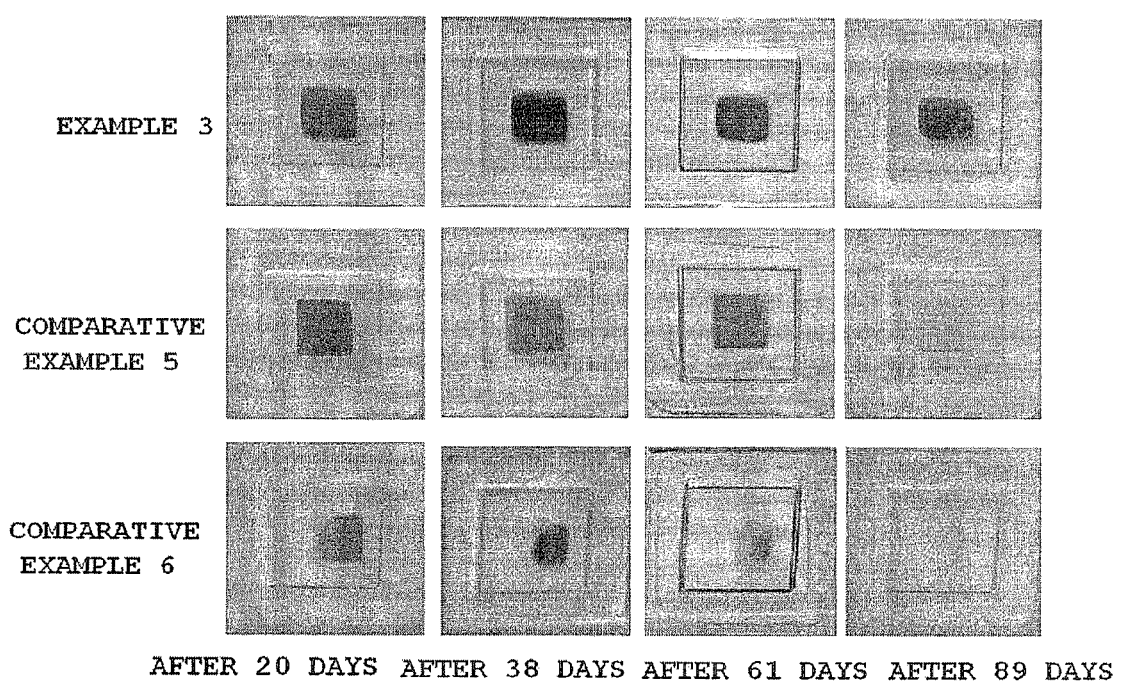

[Fig. 7]
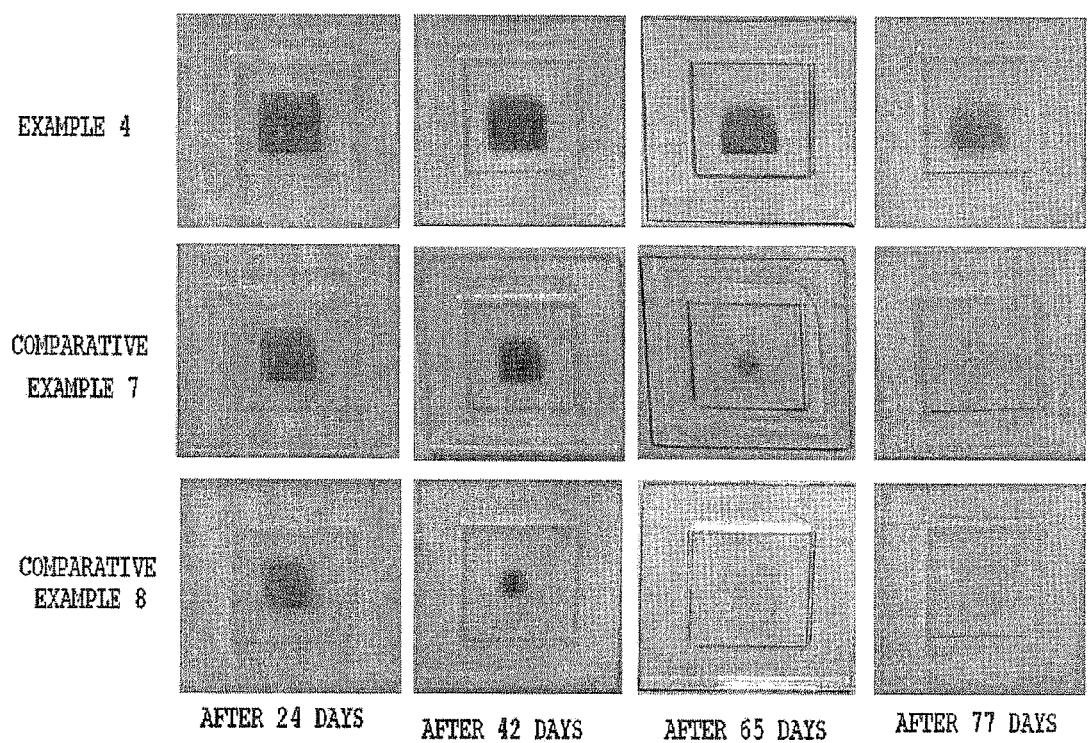

MULTIPLE-LAYER, MULTIPLE FILM HAVING THE SAME AND ELECTRONIC DEVICE HAVING THE SAME

This application claims the benefit of PCT/KR2008/004119 filed on Jul. 11, 2008, along with Korean Patent Application No. 10-2007-0069990 filed on Jul. 12, 2007, both of which are hereby incorporated herein by reference for all purposes in their entirety.

TECHNICAL FIELD

The present invention relates to a multiple layer which is excel lent in gas and moisture barrier properties and light transmittance, and a multiple film that includes the same, and an electronic device.

This application claims priority benefits from Korean Patent Application No. 2007-0069990, filed on Jul. 12, 2007, the entire contents of which are fully incorporated herein by reference.

BACKGROUND ART

Internal electronic components, used for manufacturing an organic or inorganic light emitting device, a display device, a solar cell device or the like, have to be protected from environmental chemicals such as oxygen and moisture. Conventionally, glass plates are used as a substrate or cover sheet to protect the internal electronic components which are susceptible to the chemicals. The glass plates are advantageous in that they exhibit satisfactory characteristics in light transmittance, thermal expansion coefficient, and chemical resistance. However, since they tend to break easily, be heavy and hard, there are some limitations in terms of ease of handling and design.

Recently, there are many studies to replace the glass plate used as a substrate for such electronic devices with plastic counterparts, since the plastic substrate is advantageous over the glass plate in terms of weight, impact-resistant and flexibility. Unfortunately, since commercially available plastic films have many drawbacks, compared with the glass plate, improvements in physical properties, in particular, gas barrier property, are necessary.

When an inorganic material that is metal oxides or nitrides is layered on a plastic substrate in order to produce a multiple film, it is known that the gas barrier property of the multiple film increases as the thickness of the inorganic layer is increased. However, if the thickness thereof is increased to a certain level or more, which depends on the kind of the inorganic material that is used or the film formation condition, it is known that further increase in the gas barrier property is insignificant (Thin Solid Films 388 (2001) 78; Vacuum 68 (2003) 113). This level-off behavior comes from defects present in the inorganic layer, and in order to overcome the above limit and increase the gas barrier property, in the related art, there is an example of a specially designed structure in which organic and inorganic layers are repeatedly stacked several times (Barix™ film structure manufactured by Vitex, Co., Ltd.). However, in the multiple film of the repeatedly stacked structure, there are a number of interfaces of the organic and inorganic layers having different surface characteristics and, therefore, the adhesion failure between the layers can easily occur.

Meanwhile, gas barrier films are produced by depositing inorganic materials of metal oxides or nitrides including $SiO_x$, $AlO_y$, $SiO_aN_b$, $AlO_cN_d$, ITO and the like, which have the excellent gas barrier property, on plastic films having flexibility, but the inorganic material layers that are formed by the above art are susceptible to moisture and the gas transmission rate increases under humidity (Surf. Coat. Tech., 74/75 (1995) 676; Surf. Coat. Tech., 142/144 (2001) 163).

In addition, the gas barrier film has a disadvantage in that the moisture transmittance continuously increases with time. This is the result of degradation of the inorganic material layer due to moisture. Accordingly, it is necessary to prevent degradation of the inorganic material layer under humidity by putting a protective layer that has water resistance or the water repellent property on the inorganic material layer.

Meanwhile, it is known that metal aluminum is better than aluminum oxides in terms of the moisture barrier performance (Thin Solid Films, 355/356 (1999) 500), and among the deposition modes for metal oxides, that is, the oxide and metal modes, the metal mode gives a deposition layer with a better moisture barrier property (J. Electrochem. Soc., 149 (2002) B 487).

Korean Patent Registration No. 10-0575563 discloses a structure in which a metal oxide and a metal (for example, Ag) are layered in contact with each other. The metal layer is excellent in moisture barrier performance but the light transmittance is largely reduced (J. Appl. Phys., 47 (1976) 4968) and, therefore, in the above patent, a method for maintaining the light transmittance by additionally putting the reflection prevention layer is suggested. In this case, in order to obtain the excellent light transmittance, it is necessary to precisely control the refractive index and the thickness of the reflection prevention layer that is the additionally layered.

DISCLOSURE

Technical Problem

Accordingly, it is an object of the present invention to provide a multiple layer which is excellent in gas and moisture barrier properties and light transmittance, a multiple film that includes the same, and an electronic device.

Technical Solution

The present invention provides a multiple layer that comprises two or more first inorganic material layers; and one or more second inorganic material layers that are positioned between the two first inorganic material layers and have the thickness of more than 0 and less than 5 nm. The first inorganic material layer is formed of one or more materials that are selected from silicon oxides, silicon carbide, silicon nitride, aluminum nitride and ITO, and the second inorganic material layer is formed of one or more materials that are selected from magnesium, calcium, aluminum, gallium, indium, zinc, tin, barium, and oxides and fluorides thereof.

The present invention provides a multiple layer that comprises two or more first sub multiple layers; and one or more second sub multiple layers. At least one layer of the second sub multiple layer is positioned between the two first sub multiple layers, the thickness thereof is more than 0 nm and less than 5 nm, and the first sub multiple layer is thicker than the second sub multiple layer, and the first and second sub multiple layers are formed of a mixture of one or more materials that are selected from silicon oxides, silicon carbide, silicon nitride, aluminum nitride and ITO; and one or more materials that are selected from magnesium, calcium, aluminum, gallium, indium, zinc, tin, barium, and oxides and fluorides thereof.

The present invention provides an electronic device that comprises the multiple layer.

The present invention provides a multiple film that comprises a base layer; and a multiple layer that is provided on at least one side of the base layer, and comprises two or more first inorganic material layers, and one or more second inorganic material layers that are positioned between the two first inorganic material layers and have the thickness of more than 0 and less than 5 nm. The first inorganic material layer is formed of one or more materials that are selected from silicon oxides, silicon carbide, silicon nitride, aluminum nitride and ITO, and the second inorganic material layer is formed of one or more materials that are selected from magnesium, calcium, aluminum, gallium, indium, zinc, tin, barium, and oxides and fluorides thereof.

The present invention provides a multiple film that comprises a base layer; and a multiple layer that is provided on at least one side of the base layer, and comprises two or more first sub multiple layers, and one or more second sub multiple layers. At least one of the second sub multiple layers is positioned between the two first sub multiple layers, the thickness thereof is more than 0 nm and less than 5 nm, and the first sub multiple layer is thicker than the second sub multiple layer, and the first and second sub multiple layers are formed of a mixture of one or more materials that are selected from silicon oxides, silicon carbide, silicon nitride, aluminum nitride and ITO; and one or more materials that are selected from magnesium, calcium, aluminum, gallium, indium, zinc, tin, barium, and oxides and fluorides thereof.

The present invention provides an electronic device that comprises the multiple film.

Advantageous Effects

According to the present invention, by increasing the stability with respect to the moisture, a multiple film which is excellent in gas and moisture barrier properties and light transmittance under an atmosphere in which the humidity is high is provided, thereby being used as a substrate material, or a protective cover in an electronic devices such as a light emitting device, a display device, and a photovoltaic device, and also as a packaging material that requires a high gas barrier property.

In addition, when the second inorganic material layer that has the thickness of more than 0 nm and less than 5 nm is provided between the first inorganic material layers or the second sub multiple layer that has the thickness of more than 0 nm and less than 5 nm is provided between the first sub multiple layers, it is expected that the deposition of the first inorganic material layer or the first sub multiple layer is periodically initialized by the second inorganic layer or the second sub multiple layer. That is, it can be provided that the growth or connection of the defects between the layers is suppressed as in the known film structure in which the organic layer and the inorganic layer are repeated several times (Barix™ film structure manufactured by Vitex, Co., Ltd.) by the repetition of the organic layer and the inorganic layer, and if the kinds of the inorganic materials of the first and second inorganic material layers are different from each other, this effect can be more improved.

In addition, unlike the known film structure using the organic layer and the inorganic layer, since inorganic layers are used, the delamination problem between the layers can be reduced.

DESCRIPTION OF DRAWINGS

FIG. 1 is a side view of a multiple layer 150 that includes first inorganic material layers 111 and 112 and a second inorganic material layer 120 according to the present invention;

FIG. 2 is a side view of a multiple film 250, manufactured by forming a multiple layer 150 on a base layer 210 according to the present invention;

FIG. 3 is a side view of the multiple film 350, in which the coating layers 311 and 312 are added to an upper surface and a lower surface of the multiple layer 150 and the multiple layer 150 is formed on the base layer 210 according to the present invention;

FIG. 4 is a side view of a multiple film 450 that is produced by laminating two multiple films 250, facing the base surfaces or multiple layer surfaces of the two multiple films, by an adhesive layer 410;

FIG. 5 is a side view and a plan view of the structure of a calcium test cell that is produced by using the multiple film in order to evaluate the gas barrier property of the multiple film according to the present invention;

FIG. 6 is a picture which shows with time the oxidation of the calcium test cell that is produced by using the multiple films produced in Example 3, and Comparative Examples 5 and 6 as a substrate; and FIG. 7 is a picture which shows with time the oxidation of the calcium test cell that is produced by using the multiple films produced in Example 4, and Comparative Examples 7 and 8 as a substrate.

BEST MODE

A multiple film according to the present invention comprises a base layer; and a multiple layer that is provided on at least one side of the base layer, and comprises two or more first inorganic material layers, and one or more second inorganic material layers that are positioned between the two first inorganic material layers and have the thickness of more than 0 and less than 5 nm. The first inorganic material layer is formed of one or more materials that are selected from silicon oxides, silicon carbide, silicon nitride, aluminum nitride and ITO, and the second inorganic material layer is formed of one or more materials that are selected from magnesium, calcium, aluminum, gallium, indium, zinc, tin, barium, and oxides and fluorides thereof.

As the base layer, a plastic film that has flexibility and transparency may be used.

The plastic film may be formed of, for example, one or more materials that are selected from polyethylene terephthalate (PET), polyether sulfone (PES), polycarbonate (PC), polyethylene naphthalate (PEN), polyimide (PI), polyarylate and an epoxy resin.

In addition, in order to improve the mechanical and thermal properties of the plastic film, one or more that are selected from the simple fillers or fiber-type fillers, and a mixture thereof may be further added thereto.

As the simple fillers, for example, one or more that are selected from metal, glass powder, diamond powder, silicon oxide, clay, calcium phosphate, magnesium phosphate, barium sulfate, aluminum fluoride, calcium silicate, magnesium silicate, barium silicate, barium carbonate, barium hydroxide, and aluminum silicate may be used. In addition, as the fiber-type fillers, glass fiber and woven glass cloth may be used.

The multiple layer includes two or more first inorganic material layers, and one or more second inorganic material layers that are positioned between the first inorganic material layers. In addition, the second inorganic material layer may be further provided between the base layer and the first inorganic material layer.

The total thickness of the multiple layer may be in the range of 10~5000 nm, preferably in the range of 10~1000 nm, and more preferably in the range of 10~300 nm.

If the total thickness of the multiple layer is less than 10 nm, it is difficult to accomplish the desired level of the gas barrier property, and if the total thickness of the multiple layer is more than 5000 nm, it is difficult to expect the increase of the gas barrier property with the thickness or the flexibility of the multiple layer is reduced so as to easily generate cracks.

The multiple layer may be formed by a chemical deposition method (CVD), a sputtering method, an evaporation method, and an ion plating method, but not limited thereto.

The silicon oxides of the first inorganic material layer are $SiO_x$ (x is a real number between 1.0 and 2.5), the silicon carbide is SiC, the silicon nitride is $SiO_aN_b$ (the sum of a and b is a real number between 1.0 and 2.5), and the aluminum nitride is $AlO_cN_d$ (the sum of c and d is a real number between 1.0 and 2.0). However, these are not limited thereto, and silicon oxides, silicon carbide, silicon nitride and aluminum nitride may not be limited thereto as long as they are capable of being used in a known plastic film.

The second inorganic material layer is provided between the first inorganic material layers. In this case, according to the kind of the used inorganic materials, it is necessary to appropriately maintain the thickness. If the thickness of the second inorganic material layer is too thick, the intrinsic property of the second inorganic material layer is manifested so as to cause undesirable stress in the multiple layer, thus reducing the gas barrier property on the contrary to the expectation.

The thickness of the second inorganic material layer is more than 0 nm and less than 5 nm, preferably not less than 0.1 nm and less than 5 nm, and more preferably not less than 0.5 nm and less than 5 nm or not less than 0.5 nm and less than 3 nm.

If the thickness of the second inorganic material layer is not less than 0.1 nm, it is easier to form the continuous layer and the uniform second inorganic material layer can be more easily formed and thus the layering effect of the second inorganic material layer becomes improved.

If the thickness of the second inorganic material layer becomes thick to 5 nm or more, the intrinsic property of the second inorganic material layer is manifested or the internal stress in the multiple layer can occur and thus the multiple layer including this can be easily damaged, thereby reducing the gas barrier property.

As described above, by positioning the second inorganic material layer that has the thickness of more than 0 nm and less than 5 nm between the first inorganic material layers, the gas barrier property, the stability with respect to moisture, accordingly, the moisture barrier property, and the light transmittance are improved. Since the gas barrier property is increased even though the layer of magnesium, calcium, aluminum, gallium, indium, zinc, tin, barium, and oxides or fluorides thereof is very thin, it is considered that the gas barrier property of the inorganic material is maximized by increasing the stability or water repellent property of the inorganic materials used in the related art with respect to moisture or reducing the internal stress that occurs in the inorganic material layer when moisture permeates.

In addition, by positioning the second inorganic material layer, the thickness of which is more than 0 nm and less than 5 nm, between the first inorganic layers, it is expected that deposition of the first inorganic materials is periodically initialized by the second inorganic material layer. That is, the same effect as in the known Barix™ film structure, where the growth of defects in the inorganic layer or the connection of the defects between the inorganic layers is suppressed by the repetition of the organic layer and the inorganic layer, is achieved by the fine layering structure of the inorganic material layers. If the kinds of the inorganic materials of the first and second inorganic layers are different from each other, this effect can be more improved.

In addition, since the inorganic layers are continuously layered, delamination between two adjacent layers, which could easily occur at the interface in case of organic and inorganic layers, can be reduced and therefore the excellent gas barrier property can be achieved.

The multiple film according to the present invention may further include coating layers provided on one side or both sides of the multiple layer.

The coating layer may be provided in order to increase adhesion between the base layer and the multiple layer, relax the stress that is applied to the multiple layer upon mechanical deformation, and prevent damages of the multiple layer upon handling the multiple film.

The coating layer may be formed using one or more materials that are selected from a sol-gel coating solution composition, an acrylic coating solution composition, an epoxy coating solution composition, and a urethane coating solution composition.

The sol-gel coating solution composition may include, for example, organic silane and metal alkoxide, which are described in Korean Patent Nos. 2006-0041696, 2008-0012553, and 2008-0012555, and may further include appropriate additives, solvents, or reaction catalysts.

The coating layer may be formed by, singly or in combination, a thermal curing or photo curing method.

The thickness of the cured coating layer may be in the range of 0.1~20 μm, preferably in the range of 0.3~10 μm, and more preferably in the range of 0.5~5 μm.

Meanwhile, a multiple film according to the present invention comprises a base layer; and a multiple layer that is provided on at least one side of the base layer, and comprises two or more first sub multiple layers, and one or more second sub multiple layers. At least one layer of the second sub multiple layer is positioned between the two first sub multiple layers, the thickness thereof is more than 0 nm and less than 5 nm, and the first sub multiple layer is thicker than the second sub multiple layer, and the first and second sub multiple layers are formed of a mixture of one or more materials that are selected from silicon oxides, silicon carbide, silicon nitride, aluminum nitride and ITO; and one or more materials that are selected from magnesium, calcium, aluminum, gallium, indium, zinc, tin, barium, and oxides and fluorides thereof. All the contents as described above are applied in the same manner, thus a detailed description thereof will be omitted.

As described above, by positioning the second sub multiple layer that has the thickness of more than 0 nm and less than 5 nm between the first sub multiple layers, the gas barrier property, the stability to moisture, accordingly, the moisture barrier property, and the light transmittance are improved. Since the gas barrier property is increased even though the layer of magnesium, calcium, aluminum, gallium, indium, zinc, tin, barium, and oxides or fluorides thereof is very thin, it is considered that the gas barrier property of inorganic materials is maximized by increasing the stability or the water repellent property of the inorganic materials used in the related art with respect to moisture or reducing the internal stress that develops in the inorganic material layer when moisture permeates.

In addition, by positioning the second sub multiple layer the thickness of which is more than 0 nm and less than 5 nm between the first sub multiple layers, it is expected that deposition of the first sub multiple layer is periodically initialized by the second sub multiple layer. That is, the same effect as in the known Barix™ film structure, where the growth of defects in the inorganic layer or the connection of the defects between the inorganic layers is prevented by the repetition of the organic and inorganic layers, is achieved by the fine layering structure of the sub multiple layers.

In addition, since the inorganic layers are continuously layered, delamination between two adjacent layers, which could easily occur at the interface in case of organic and inorganic layers, can be reduced and therefore the excellent gas barrier property can be achieved.

Here, the inorganic materials of the first and second sub multiple layers may be the same with each other or different from each other. Preferably, the inorganic materials of the first sub multiple layer and the second sub multiple layer may be different from each other.

The multiple film that comprises the multiple layer according to the present invention may be used as a substrate material, a protective cover, or a packaging material in an electronic device such as an organic or an inorganic light emitting body, a display device, and a photovoltaic device.

Meanwhile, another embodiment of the present invention may provide a multiple layer that comprises two or more first inorganic material layers; and one or more second inorganic material layers that are positioned between the two first inorganic material layers and have the thickness of more than 0 and less than 5 nm. The first inorganic material layer is formed of one or more materials that are selected from silicon oxides, silicon carbide, silicon nitride, aluminum nitride and ITO, and the second inorganic material layer is formed of one or more materials that are selected from magnesium, calcium, aluminum, gallium, indium, zinc, tin, barium, and oxides and fluorides thereof. All the description of the multiple layer of the multiple film is also applied to the present embodiment, and thus a detailed description thereof will be omitted.

In addition, another embodiment of the present invention may provide a multiple layer that comprises two or more first sub multiple layers; and one or more second sub multiple layers. At least one layer of the second sub multiple layer is positioned between the two first sub multiple layers, the thickness of which is more than 0 nm and less than 5 nm, and the first sub multiple layer is thicker than the second sub multiple layer, and the first and second sub multiple layers are formed of a mixture of one or more materials that are selected from silicon oxides, silicon carbide, silicon nitride, aluminum nitride and ITO; and one or more materials that are selected from magnesium, calcium, aluminum, gallium, indium, zinc, tin, barium, and oxides and fluorides thereof. All the description of the multiple layer in the multiple film is also applied in the present embodiment, and thus a detailed description thereof will be omitted.

As described above, the multiple layer may be applied to electronic devices, without the base layer used in the multiple film, as a protective layer of electronic devices.

In detail, the multiple layer may be used a protective cover, or a packaging material in electronic devices such as an organic or an inorganic light emitting body, a display device, and a photovoltaic device without the base layer.

MODE FOR INVENTION

Hereinafter, with reference to FIGS. 1 to 4, the multiple film according to the present invention will be described in detail.

As shown in FIG. 1, a multiple layer 150 of the multiple film according to the present invention includes a pair of first inorganic material layers 111 and 112; and a second inorganic material layer 120 that is provided between a pair of first inorganic material layers 111 and 112.

As shown in FIG. 2, a multiple film 250 according to the present invention includes a base layer 210; and a multiple layer 150 that is provided on the base layer 210.

As shown in FIG. 3, a multiple film 350 according to the present invention includes a base layer 210; the first coating layer 312 that is provided on the base layer 210; a multiple layer 150 that is provided on the first coating layer 312; and the second coating layer 311 that is provided on the multiple layer 150.

As shown in FIG. 4, a multiple film 450 according to the present invention includes two multiple films 250 that are shown in FIG. 2; and an adhesive agent layer 410 which is provided between the two multiple films 250.

Hereinafter, the present invention will be described in detail in light of Examples and Experimental Examples. The present invention may, however, be embodied in many different forms and should not be construed as being limited to the Examples and Experimental Examples set forth herein. Rather, these Examples and Experimental Examples are provided such that this disclosure will be thorough and complete and will fully convey the concept of the present invention to those skilled in the art.

Example 1

As the plastic base layer, a PET film (A4300, manufactured by Toyobo, Co., Ltd.) which had the thickness of 100 μm was used. The silane-based sol type solution that included 32.5 parts by weight of tetraethoxysilane and 64.0 parts by weight of glycidyloxypropyltrimethoxysilane as the main components was coated on the upper surface of the plastic base layer, and subjected to the thermal curing at 120° C. for 10 min to form the coating layer that had the thickness of about 0.6 μm. While a mixed gas of argon and oxygen was supplied to the deposition equipment, the first inorganic material layer that consisted of $SiO_2$ was deposited on the upper surface of the coating layer by using the sputtering method so that the thickness was 17 nm, the second inorganic material layer that consisted of $Al_2O_3$ was deposited on the $SiO_2$ first inorganic material layer so that the thickness was 1 nm, and the $SiO_2$ first inorganic material layer was deposited on the $Al_2O_3$ second inorganic material layer so that the thickness was 12 nm to form the multiple layer. The silane-based sol type solution was coated on the multiple layer and subjected to the thermal curing as in coating the upper surface of the base layer to form the outer coating layer and thus produced is the multiple film. The water vapor transmission rate (WVTR) of the multiple film was evaluated with the L80-5000 manufactured by Lyssy, Co., Ltd., and the light transmittance was measured with the Cary 3E manufactured by Varian, Co., Ltd., and the results are described in the following Table 1.

Comparative Example 1

The WVTR and the light transmittance of the plastic base (A4300, manufactured by Toyobo, Co., Ltd.) were measured without the multiple layer deposited.

Comparative Example 2

The multiple film was produced by using the same method as Example 1, except that all the three layers were formed of $SiO_2$ and then measured were the WVTR and the light transmittance.

TABLE 1

| | Deposition configuration | Water vapor transmission rate (g/m² · day) | Light transmittance (%, 550 nm) | Thickness of the deposition layer (nm) (Thickness of each layer) |
|---|---|---|---|---|
| Example 1 | $SiO_2/Al_2O_3/SiO_2$ | 0.05 | 91 | 30 (17/1/12) |
| Comparative Example 1 | Only the base layer | 3.7 | 92 | — |
| Comparative Example 2 | $SiO_2/SiO_2/SiO_2$ | 0.10 | 89 | 30 (17/1/12) |

Example 2

As the plastic base layer, the PET film (A4300, manufactured by Toyobo, Co., Ltd.) that had the thickness of 100 μm was used. The silane-based sol type solution that included 40.0 parts by weight of tetraethoxysilane and 56.5 parts by weight of glycidyloxypropyltrimethoxysilane as the main components was coated on the upper surface of the plastic base layer, and subjected to the thermal curing at 120° C. for 10 min to form the coating layer that had the thickness of about 0.8 μm. While a mixture gas of argon and oxygen was supplied to the deposition equipment, the first inorganic material layer that consisted of $SiO_2$ was deposited on the upper surface of the coating layer by using the sputtering method so that the thickness was 32 nm, the second inorganic material layer that consisted of $Al_2O_3$ was deposited on the $SiO_2$ first inorganic material layer so that the thickness was 4 nm, and the $SiO_2$ first inorganic material layer was deposited on the $Al_2O_3$ second inorganic material layer so that the thickness was 26 nm to form the multiple layer. The silane-based sol type solution was coated on the multiple layer and subjected to the thermal curing as in coating the upper surface of the base layer to form the outer coating layer and thus produced is the multiple film. The WVTR was evaluated by using the L80-5000 manufactured by Lyssy, Co., Ltd., and the light transmittance was measured by the Cary 3E manufactured by Varian, Co., Ltd., and the results are described in the following Table 2.

Comparative Example 3

The multiple film was produced by using the same method as Example 2, except that the $Al_2O_3$ second inorganic material layer was not formed on the $SiO_2$ first inorganic material layer and the first inorganic material layer that consisted of $SiO_2$ was formed so that the thickness thereof was 30 nm, and the WVTR and the light transmittance were measured.

Comparative Example 4

The multiple film was produced by using the same method as Example 2, except that the $Al_2O_3$ second inorganic material layer was formed on the $SiO_2$ first inorganic material layer that was formed on the coating layer so that the thickness thereof was 45 nm and the $SiO_2$ first inorganic material layer was not formed on the $Al_2O_3$ second inorganic material layer and the WVTR and the light transmittance were measured.

TABLE 2

| | Deposition configuration | Water vapor transmission rate (g/m² · day) | Light transmittance (%, 550 nm) | Thickness of the deposition layer (nm) (Thickness of each layer) |
|---|---|---|---|---|
| Example 2 | $SiO_2/Al_2O_3/SiO_2$ | 0.032 | 92 | 32/4/26 |
| Comparative Example 3 | $SiO_2/SiO_2$ | 0.182 | 91 | 32/30 |
| Comparative Example 4 | $SiO_2/Al_2O_3$ | 0.057 | 92 | 32/45 |

In Tables 1 and 2, if Examples 1 and 2 and Comparative Examples 1~4 are compared with each other, it can be seen that the excellent moisture barrier property and light transmittance are provided in Example 1 and 2 since the water transmittance is low and the light transmittance is high. In Examples 1 and 2, it is considered that $Al_2O_3$ of the second inorganic material layer is reacted with silicon oxide of the first inorganic material layer to reduce the decomposition of the silicon oxide layer as the first inorganic material layer by the moisture and thus increase the stability of the multiple film with respect to moisture. Therefore, the excellent gas barrier property can be provided.

Example 3

On the same plastic film as Example 1, the coating layer was formed by using the same method as Example 1, on the upper surface of the coating layer the first inorganic material layer that consisted of $Si_3N_4$ was deposited by using the sputtering method while a mixed gas of argon, oxygen, and nitrogen flew so that the thickness thereof was 35 nm, on the first inorganic material layer of $Si_3N_4$ the second inorganic material layer that consisted of $Al_2O_3$ was deposited so that the thickness thereof was 2 nm, and on the $Al_2O_3$ second inorganic material layer the first inorganic material layer that consisted of $Si_3N_4$ was deposited so that the thickness thereof was 37 nm to form the multiple layer. On the multiple layer, the outer coating layer was formed by using the same method as Example 1 to produce the multiple film.

Example 4

On the same plastic film as Example 1, the coating layer was formed by using the same method as Example 1, on the upper surface of the coating layer the inorganic material layer that consisted of $SiO_2$ was deposited by using the sputtering method while a mixed gas of argon, oxygen, and nitrogen flew so that the thickness thereof was 15 nm, on the first inorganic material layer of $SiO_2$ the second inorganic material layer that consisted of $CaF_2$ was deposited so that the thickness thereof was 2 nm, and on the $CaF_2$ second inorganic material layer the first inorganic material layer that consisted of $Si_3N_4$ was deposited so that the thickness thereof was 50 nm to form the multiple layer. On the multiple layer, the outer coating layer was formed by using the same method as Example 1 to produce the multiple film.

Comparative Example 5

The multiple film was produced by using the same method as Example 3, except that the $Al_2O_3$ second inorganic material layer was not formed.

Comparative Example 6

The multiple film was produced by using the same method as Example 3, except that the thickness of the $Al_2O_3$ second inorganic material layer was 6 nm.

Comparative Example 7

The multiple film was produced by using the same method as Example 4, except that the $CaF_2$ second inorganic material layer was not formed.

Comparative Example 8

The multiple film was produced by using the same method as Example 4, except that the thickness of the $CaF_2$ second inorganic material layer was 8 nm.

The configuration of the multiple films that were produced in Example 3 and 4 and Comparative Examples 5~8 is represented in the following Table 3.

TABLE 3

|  | Deposition configuration | Thickness of the deposition layer (nm) |
| --- | --- | --- |
| Example 3 | $Si_3N_4/Al_2O_3/Si_3N_4$ | 35/2/37 |
| Example 4 | $SiO_2/CaF_2/Si_3N_4$ | 15/2/50 |
| Comparative Example 5 | $Si_3N_4/Si_3N_4$ | 35/37 |
| Comparative Example 6 | $Si_3N_4/Al_2O_3/Si_3N_4$ | 35/6/37 |
| Comparative Example 7 | $SiO_2/Si_3N_4$ | 15/50 |
| Comparative Example 8 | $SiO_2/CaF_2/Si_3N_4$ | 15/8/50 |

Experimental Example

Evaluation of the WVTR Using the Calcium Cell

In order to evaluate the WVTR, the calcium test cell shown in FIG. 5 was fabricated. The multiple films that were produced in Examples 3 and 4 and Comparative Examples 5~8 were used as the substrate material, and calcium was deposited so that the thickness thereof was about 50 nm, and the glass plate was used as the cover plate.

In the calcium cell, the opaque calcium in the early stage was oxidized and became transparent with time as moisture and oxygen in the environment were permeated through the substrate material. Therefore, if the black portion in the calcium cell remains large, the gas barrier property of the multiple film that was used as the substrate material is excellent.

In FIG. 6, it can be seen that in Example 3, where the $Al_2O_3$ layer that had the thickness of 2 nm was used as the second inorganic material layer and the silicon nitride layer was used as the first inorganic material layer, the gas barrier property was increased. Comparative Example 5 relates to the case that there is no second inorganic material layer, and Comparative Example 6 relates to the case that the thickness of the second inorganic material layer is larger than 5 nm, and the gas barrier property is lower than in Example 3.

In FIG. 7, it can be seen that, in comparison with inorganic material layers used in the related art, the stability to moisture was largely improved in Example 4 where the $CaF_2$ layer that had the thickness of 2 nm was used in the second inorganic material layer by the action of fluorine, that is, etching weakly-bonded part of the $SiO_2$ first layer or increasing the water repellent property of the defects in the $SiO_2$ layer. In addition, calcium that has excellent reactivity with moisture functions to inhibit the transport of moisture in the inorganic layer and therefore the moisture barrier property of the inorganic material layer can be increased. Comparative Example 7 relates to the case there is no second inorganic material layer, Comparative Example 8 relates to the case the second inorganic material layer is thicker than 5 nm, and it can be seen that the gas barrier property is inferior.

The invention claimed is:

1. A multiple layer comprising:
two or more first inorganic material layers; and
one or more second inorganic material layers that are positioned between the two first inorganic material layers, the second inorganic material layer having the thickness of less than 5 nm
wherein the first inorganic material layer is formed of one or more materials that are selected from the group consisting of silicon oxides, silicon carbide, silicon nitride, aluminum nitride and ITO, and
the second inorganic material layer is formed of one or more materials that are selected from the group consisting of magnesium, calcium, aluminum, gallium, indium, zinc, tin, barium, and oxides and fluorides thereof.

2. The multiple layer as set forth in claim 1, wherein the thickness of the second inorganic material layer is not less than 0.1 nm and less than 5 nm.

3. The multiple layer as set forth in claim 1, wherein the thickness of the multiple layer is in the range of 10-5000 nm.

4. The multiple layer as set forth in claim 1, wherein the silicon oxides are $SiO_x$ (x is a real number in the range of 1.0 to 2.5), the silicon carbide is SiC, the silicon nitride is $SiO_aN_b$ (the sum of a and b is a real number in the range of 1.0 to 2.5), and the aluminum nitride is $AlO_cN_d$ (the sum of c and d is a real number in the range of 1.0 to 2.0).

5. A multiple layer comprising:
two or more first sub multiple layers; and
one or more second sub multiple layers,
wherein at least one layer of the second sub multiple layers is positioned between the two first sub multiple layers, the thickness of the second sub multiple layer is less than 5 nm, and the first sub multiple layer is thicker than the second sub multiple layer, and
the first and second sub multiple layers are formed of a mixture of one or more materials that are selected from silicon oxides, silicon carbide, silicon nitride, aluminum nitride and ITO and one or more materials that are selected from magnesium, calcium, aluminum, gallium, indium, zinc, tin, barium, and oxides and fluorides thereof.

6. The multiple layer as set forth in claim 5, wherein the thickness of the second sub multiple layer is not less than 0.1 nm and less than 5 nm.

7. The multiple layer as set forth in claim 5, wherein the thickness of the multiple layer is in the range of 10~5000 nm.

8. The multiple layer as set forth in claim 5, wherein the silicon oxides are $SiO_x$ (x is a real number in the range of 1.0 to 2.5), the silicon carbide is SiC, the silicon nitride is $SiO_aN_b$ (the sum of a and b is a real number in the range of 1.0 to 2.5), and the aluminum nitride is $AlO_cN_d$ (the sum of c and d is a real number in the range of 1.0 to 2.0).

9. A multiple film comprising:
a base layer;
a multiple layer that is provided on at least one side of the base layer, and comprises two or more first inorganic material layers, and one or more second inorganic material layers that are positioned between the two first inorganic material layers, the second inorganic material layer having the thickness of less than 5 nm, wherein the first inorganic material layer is formed of one or more materials that are selected from the group consisting of silicon oxides, silicon carbide, silicon nitride, aluminum nitride and ITO, and the second inorganic material layer is formed of one or more materials that are selected from the group consisting of magnesium, calcium, aluminum, gallium, indium, zinc, tin, barium, and oxides and fluorides thereof.

10. The multiple film as set forth in claim 9, wherein the thickness of the second inorganic material layer is not less than 0.1 nm and less than 5 nm.

11. The multiple film as set forth in claim 9, wherein the thickness of the multiple layer is in the range of 10-5000 nm.

12. The multiple film as set forth in claim 9, wherein the silicon oxides are $SiO_x$ (x is a real number in the range of 1.0 to 2.5), the silicon carbide is SiC, the silicon nitride is $SiO_aN_b$ (the sum of a and b is a real number in the range of 1.0 to 2.5), and the aluminum nitride is $AlO_cN_d$ (the sum of c and d is a real number in the range of 1.0 to 2.0).

13. The multiple film as set forth in claim 9, wherein the base layer is formed of one or more materials that are selected from polyethylene terephthalate (PET), polyether sulfone (PES), polycarbonate (PC), polyethylene naphthalate (PEN), polyimide (PI), polyarylate and an epoxy resin.

14. The multiple film as set forth in claim 9, wherein the base layer further comprises one or more that are selected from a filler, an organic and inorganic hybrid material, and a mixture thereof.

15. The multiple film as set forth in claim 9, wherein the multiple film further comprises a coating layer that is provided on one side or both sides of the multiple layer.

16. A multiple film comprising:
a base layer;
a multiple layer that is provided on at least one side of the base layer, and comprises two or more first sub multiple layers, and one or more second sub multiple layers,
wherein at least one layer of the second sub multiple layer is positioned between the two first sub multiple layers, the thickness of the second sub multiple layer is less than 5 nm, and the first sub multiple layer is thicker than the second sub multiple layer, and
the first and second sub multiple layers are formed of a mixture of one or more materials that are selected from silicon oxides, silicon carbide, silicon nitride, aluminum nitride and ITO and one or more materials that are selected from magnesium, calcium, aluminum, gallium, indium, zinc, tin, barium, and oxides and fluorides thereof.

17. The multiple film as set forth in claim 16, wherein the thickness of the second sub multiple layer is not less than 0.1 nm and less than 5 nm.

18. The multiple film as set forth in claim 16, wherein the thickness of the multiple layer is in the range of 10~5000 nm.

19. The multiple film as set forth in claim 16, wherein the silicon oxides are $SiO_x$ (x is a real number in the range of 1.0 to 2.5), the silicon carbide is SiC, the silicon nitride is $SiO_aN_b$ (the sum of a and b is a real number in the range of 1.0 to 2.5), and the aluminum nitride is $AlO_cN_d$ (the sum of c and d is a real number in the range of 1.0 to 2.0).

20. The multiple film as set forth in claim 16, wherein the base layer is formed of one or more materials that are selected from polyethylene terephthalate (PET), polyether sulfone (PES), polycarbonate (PC), polyethylene naphthalate (PEN), polyimide (PI), polyarylate and an epoxy resin.

* * * * *